(12) United States Patent
Park et al.

(10) Patent No.: US 12,394,640 B2
(45) Date of Patent: Aug. 19, 2025

(54) APPARATUS FOR CLEANING WAFER

(71) Applicant: Samsung Electronics Co., Ltd., Suwon-si (KR)

(72) Inventors: Hyojin Park, Suwon-si (KR); Songyun Kang, Suwon-si (KR); Sungyong Park, Suwon-si (KR); Kiseok Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 234 days.

(21) Appl. No.: 18/200,619

(22) Filed: May 23, 2023

(65) Prior Publication Data
US 2023/0402299 A1 Dec. 14, 2023

(30) Foreign Application Priority Data
Jun. 10, 2022 (KR) .................. 10-2022-0070896

(51) Int. Cl.
*H01L 21/67* (2006.01)
*B08B 1/10* (2024.01)
*B08B 1/32* (2024.01)

(52) U.S. Cl.
CPC .......... *H01L 21/67092* (2013.01); *B08B 1/10* (2024.01); *B08B 1/32* (2024.01)

(58) Field of Classification Search
CPC ........ H01L 21/67092; B08B 1/10; B08B 1/32
USPC ...................................................... 134/137
See application file for complete search history.

(56) References Cited

U.S. PATENT DOCUMENTS

| | | | |
|---|---|---|---|
| 8,496,758 B2 | 7/2013 | Idani | |
| 9,704,729 B2 | 7/2017 | Cho et al. | |

FOREIGN PATENT DOCUMENTS

| | | |
|---|---|---|
| CN | 1243368 C | 2/2006 |
| CN | 112735940 A | 4/2021 |
| JP | 6418790 B2 | 11/2018 |
| JP | 6549936 B2 | 7/2019 |
| KR | 1020040070593 A | 8/2004 |
| KR | 102013693 B1 | 8/2019 |
| KR | 102279523 B1 | 7/2021 |

OTHER PUBLICATIONS

CN112735940A—machine translation (Year: 2021).*

* cited by examiner

*Primary Examiner* — Tinsae B Ayalew
(74) *Attorney, Agent, or Firm* — Muir Patent Law, PLLC

(57) ABSTRACT

A wafer cleaning apparatus includes a base, a roller installation table installed on the base, a wafer support unit disposed at the roller installation table and having a support roller for rotatably supporting an edge of a wafer, a pressing roller installed on the roller installation table and above the wafer support unit, and configured to press opposite surfaces of the wafer, and a driving unit providing a force in a direction, crossing a direction of a central axis of the pressing roller, so that a shape of the pressing roller is deformed. The pressing roller deformed by the driving unit applies a first pressure to a central portion of the wafer and a second pressure, different from the first pressure, to an edge portion of the water.

20 Claims, 10 Drawing Sheets

(a)

(b)

APPARATUS FOR CLEANING WAFER

CROSS-REFERENCE TO RELATED APPLICATION

This application claims the priority and benefit of Korean Patent Application No. 10-2022-0070896, filed on Jun. 10, 2022, with the Korean Intellectual Property Office, the inventive concept of which is herein incorporated herein by reference.

BACKGROUND

1. Field

The present inventive concept relates to an apparatus for cleaning a wafer.

2. Description of Related Art

In general, after a chemical mechanical polishing (CMP) process is performed, a surface of a wafer is highly contaminated, as compared to other processes. These contaminant particles may interfere with electrical signal transmission of a device and cause problems in post-processing.

In order to remove such contaminant particles, the wafer may be cleaned by being immersed in a chemical substance, but since it is impossible to completely clean the wafer, a physical cleaning method must be performed together therewith.

However, there may be a problem in that mechanical damage such as pattern collapse, scratches, tears, and the like may occur because it is difficult to precisely control cleaning power of the physical cleaning method.

SUMMARY

An aspect of the present inventive concept is to provide an apparatus for cleaning a wafer for efficiently and precisely controlling cleaning power.

According to an aspect of the present disclosure, a wafer cleaning apparatus includes a base, a roller installation table installed on the base, a wafer support unit disposed at the roller installation table and having a support roller for rotatably supporting an edge of a wafer, a pressing roller installed on the roller installation table and above the wafer support unit, and configured to press opposite surfaces of the wafer, and a driving unit providing a force in a direction, crossing a direction of a central axis of the pressing roller, so that a shape of the pressing roller is deformed. The pressing roller deformed by the driving unit applies a first pressure to a central portion of the wafer and a second pressure, different from the first pressure, to an edge portion of the wafer.

According to an aspect of the present disclosure, a wafer cleaning apparatus includes a base, a roller installation table installed on the base, a wafer support unit disposed at the roller installation table and having a support roller for rotatably supporting a wafer, and a pressing roller installed on the roller installation table and above the wafer support unit, and configured to press opposite surfaces of the wafer. The pressing roller is provided with a plurality of space portions configured to apply a pneumatic pressure on the opposite surfaces of the wafer.

According to an aspect of the present disclosure, a wafer cleaning apparatus includes a base, a pair of first installation plates fixed at the base and erected vertically from the base, a first pressing roller rotatably connected to the pair of first installation plates, wherein the first pressing roller extends in a first direction and the pair of first installation plates are spaced apart from each other in the first direction, a pair of second installation plates fixed at the base and erected vertically from the base, wherein the pair of second installation plates are spaced apart from the pair of first installation plates in a second direction perpendicular to the first direction, a second pressing roller rotatably connected to the pair of second installation plates, wherein the second pressing roller extends in the first direction and is spaced apart from the first pressing roller in the second direction, and a plurality of support rollers disposed between the base and a gap between the first and second pressing rollers, wherein the plurality of support rollers are controlled to rotate in a same direction.

BRIEF DESCRIPTION OF DRAWINGS

The above and other aspects, features, and advantages of the present inventive concept will be more clearly understood from the following detailed description taken in conjunction with the accompanying drawings, in which.

DETAILED DESCRIPTION

Hereinafter, example embodiments of the present inventive concept will be described with reference to the accompanying drawings as follows.

Figure 1:
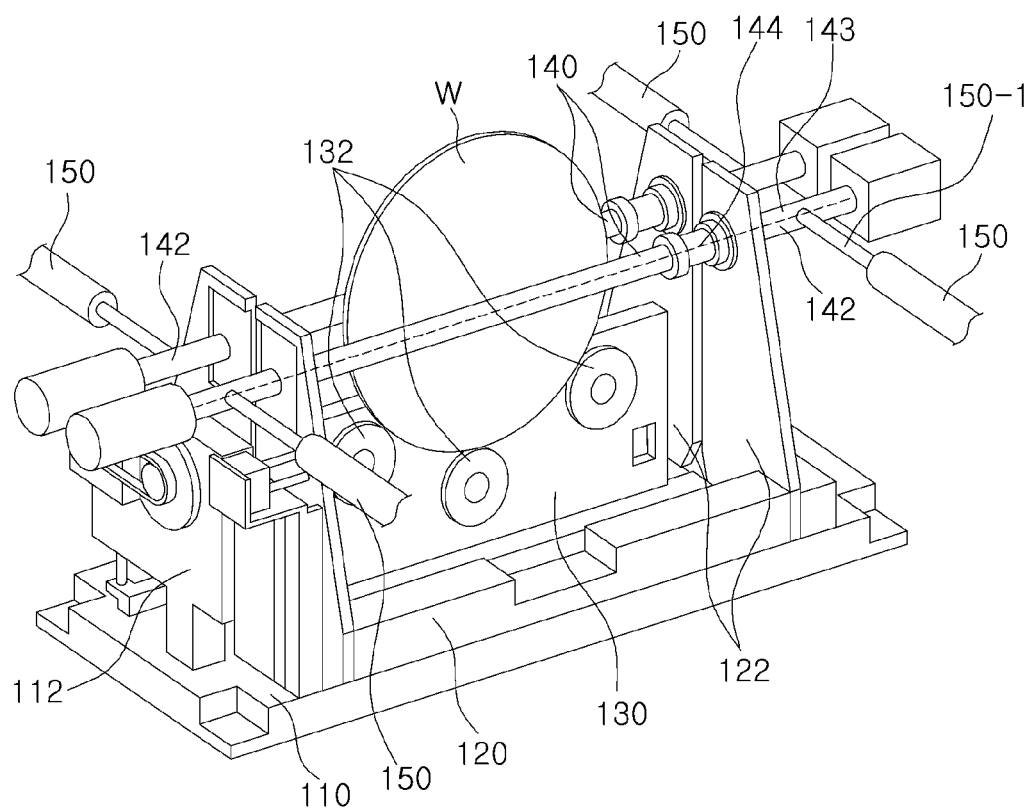
FIG. 1 is a schematic perspective view illustrating an apparatus for cleaning a water according to an example embodiment.
Figure 2:
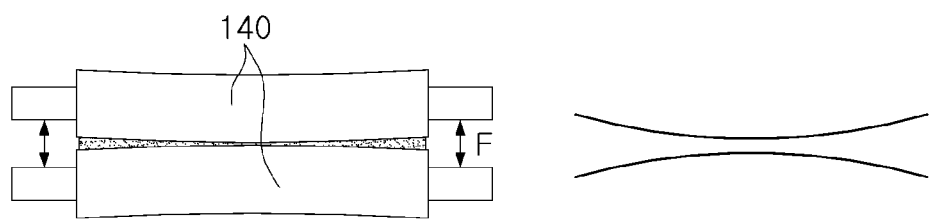
FIG. 2 is an illustrative view illustrating a pressing roller provided in an apparatus for cleaning a wafer according to an example embodiment.
Figure 2:
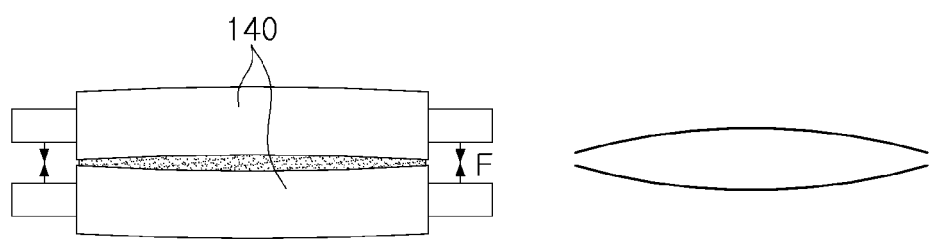

FIG. 1 is a schematic perspective view illustrating an apparatus for cleaning a wafer according to an example embodiment, and FIG. 2 is an illustrative view illustrating a pressing roller provided in an apparatus for cleaning a wafer according to an example embodiment.

Referring to FIGS. 1 and 2, an apparatus for cleaning a wafer 100 (i.e., a wafer cleaning apparatus) according to an example embodiment includes a base 110, a roller installation table 120, a wafer support unit 130, a pressing roller 140, and a driving unit 150 (i.e., a pressing roller driver).

The base 110 has, for example, a substantially rectangular plate shape. A roller installation table 120, a wafer support unit 130, and the like may be installed on an upper surface of the base 110, Meanwhile, a rotation driving unit 112 for rotation of a wafer W may be provided at one end of an upper surface of the base 110. The rotation driving unit 112 serves to rotate the wafer W when the wafer W is cleaned. To this end, the rotation driving unit 112 may be connected to a support roller 132 of the wafer support unit 130 to be described later.

The roller installation table 120 is installed on the upper surface of the base 110. As an example, the roller installation table 120 may be disposed adjacent to one side of the rotation driving unit 112. Meanwhile, the roller installation table 120 may be provided with an installation plate 122 having a predetermined height from the base 110 upwardly in order to install the pressing roller 140. In other words, two pairs of installation plates 122 on which opposite ends of the pressing roller 140 are installed may be disposed on opposite sides of the pressing roller 140 on the roller installation table 120. In some embodiments, the pressing roller 140 may include two pairs of installation plates 122, and the pressing roller 140 may include a pair of pressing rods, Each pressing rod of the pair of pressing rods may be rotatably connected to a corresponding pair of the two pairs of installation plates 122. For example, each pressing rod of the pair of pressing rods may extend in a first direction, and the pair of pressing rods may be spaced apart from each other in a second direction perpendicular to the first direction, Each pair of two pairs of installation plates may be spaced apart from each other in the first direction, and the two pairs of the installation plates 122 may be spaced apart from each other in the second direction.

The wafer support unit 130 may be disposed in a space between the roller installation table 120, and may include a support roller 132 for supporting the wafer W. As an example, a plurality of support rollers 132 may be disposed to support a lower end of the wafer W. In addition, the support roller 132 is connected to the rotation driving unit 112 so that the wafer W is rotated by the rotating support rollers 132. In some embodiments, the support rollers 132 may rotatably support the lower end of the wafer W. In the present example embodiment, a case in which three support rollers 132 are provided on one side of the wafer support unit 130 is illustrated in the drawings as an example, but the number of support rollers 132 is not limited thereto and may be variously changed. In some embodiments, the support rollers 132 and the pair of pressing rods may be configured to place the wafer vertically. For example, the wafer may be placed in a gap between the pair of pressing rods, and an edge of the lower end of the wafer may be supported by the three support rollers 132.

As described above, when the wafer W is cleaned by the support roller 132, the wafer W may be rotated clockwise or counterclockwise. In some embodiments, the three support rollers 132 may rotate in the same direction, and the wafer W may rotate in the opposite direction. For example, in the event that the three support rollers 132 rotate clockwise, the wafer may be rotated in a counter-clockwise direction using a friction force between the edge of the lower end of the wafer W and each of the three support rollers 132. The rotating wafer W may rotate the pair of pressing rods. A friction force between opposite surfaces of the wafer W and the pair of pressing rods may rotate the pair of pressing rods.

Figure 3:
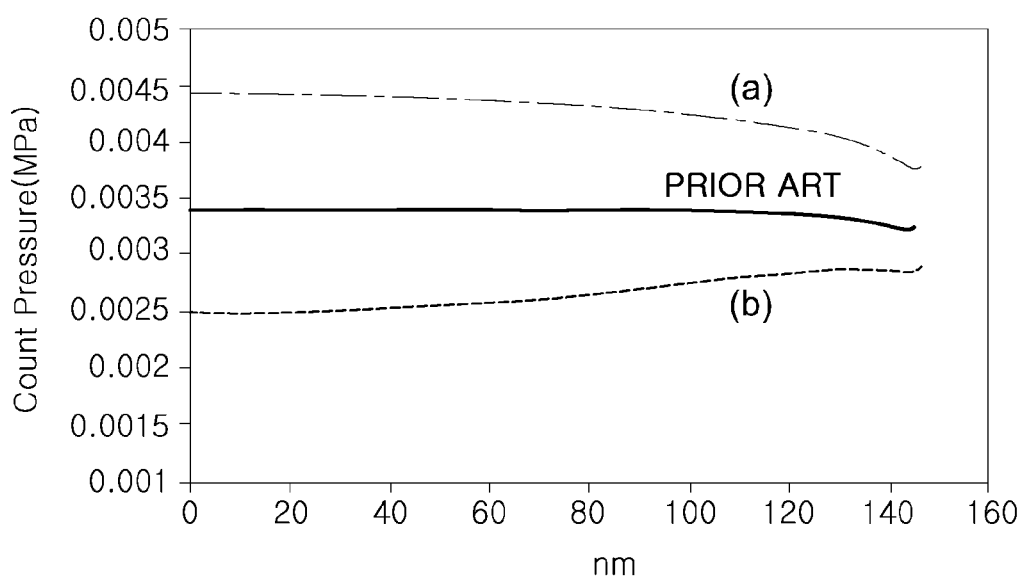
FIG. 3 is a graph illustrating pressing force according to the prior art and the pressing roller illustrated in FIG. 2.

The pressing roller 140 is installed on the roller installation table 120 to be disposed above the wafer support unit 130 to press opposite surfaces of the wafer W. As an example, a pair of the pressing rollers 140 (i.e., the pair of pressing rods) may be installed on the roller installation table 120 to press opposite surfaces of the wafer W. Meanwhile, the pressing roller 140 may be deformed so that the pressure for pressing a central portion and an edge of the wafer W is different from each other when the wafer W is pressed. To this end, the pressing roller 140 may be connected to the driving unit 150. Accordingly, as illustrated in FIG. 2, the pressing roller 140 may have a convex or concave central portion. For example, when force is applied outwardly to a central axis 142 of the pressing roller 140 by the driving unit 150, the pressing roller 140 may be deformed so that the central portion of the pressing roller 140 has a convex shape, as illustrated in FIG. 2(*a*), and when force is applied inwardly to the central axis 142 of the pressing roller 140 by the driving unit 150, the pressing roller 140 may be deformed so that the central portion of the pressing roller 140 has a concave shape, as illustrated in FIG. 2(*b*). In this case, as illustrated in FIG. 3, the pressing force may be adjusted as compared with the pressing roller in the prior art. It can be seen that FIG. 3(*a*) illustrates a high pressing force at the central portion of the wafer W and a low pressing force at the edge of the wafer W, but FIG. 3(*b*) illustrates a low pressing force at the central portion of the wafer W and a high pressing force at the edge of the wafer W. In some embodiments, the pair of pressing rods may be elastically deformed by the pressing force so that once the pressing force is released, the deformed pressing rods may return to their original shapes.

As described above, the cleaning force of the wafer W may be adjusted by adjusting a magnitude and direction of the force applied to the central axis 142 of the pressing roller 140.

The driving unit 150 causes a shape of the pressing roller 140 to be deformed. To this end, the driving unit 150 is connected to the pressing roller 140, and as an example, the driving unit 150 may include a plurality of air cylinders connected to a central axis 142 of the pressing roller 140. In other words, the driving unit 150 may be formed of an air cylinder connected to opposite ends of the central axis 142 of the pressing roller 140. For example, the driving unit 150 may further include a driving rod 150-1 that is connected to end portions of the pressing roller 140 so that a force may be applied to the end portions of the pressing roller 140 in a direction perpendicular to the central axis 142 of the pressing roller 140. In some embodiments, the central axis 142 may extend in a direction parallel to a direction along which the pressing roller 140 extends. Accordingly, the central portion of the pressing roller 140 may be deformed to be concave or convex by applying force in a direction crossing the direction of the central axis 142 of the pressing roller 140. Accordingly, a magnitude of the force applied for deformation of the pressing roller 140 may be reduced, and the deformation of the pressing roller 140 may be performed more easily. In other words, compared to the case in which the pressing roller 140 is deformed by applying force in the direction of the central axis 142 of the pressing roller 140, the shape deformation of the pressing roller 140 may be implemented with less force, and control of the shape deformation may also be performed more easily. Here, a case in which the driving unit 150 is formed of an air cylinder is described as an example, but the present inventive concept is not limited thereto, and the driving unit 150 may be formed of a sub-motor, or the like.

As described above, by deforming the shape of the pressing roller 140 by the driving unit 150, to press the wafer W, the cleaning force may be efficiently and precisely controlled.

In an embodiment, the wafer cleaning apparatus may further include a pair of first extensions 143 and a pair of first connectors 144, The pair of first connectors 144 may connect opposite ends of the pressing roller 140 to the pair of first extensions 143. The pair of first connectors 144 may be rotatably connected to the opposite ends of the pressing roller 140. The pair of first connectors 144 may be fixedly connected to the pair of first extensions 143. The pair of first extensions 143 may penetrate the pair of installation plates 122 to be connected to the pair of first connectors 144.

Figure 4:
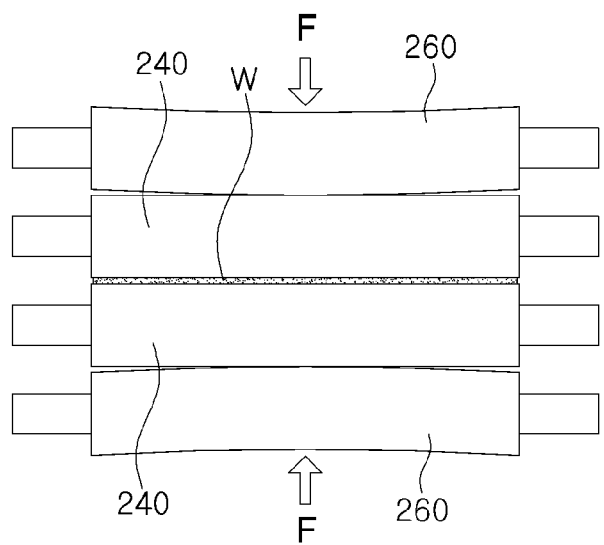
FIG. 4 is an illustrative view illustrating a pressing roller and a backup roller provided in the apparatus for cleaning a wafer according to an example embodiment.

FIG. 4 is an illustrative view illustrating a pressing roller and a backup roller provided in the apparatus for cleaning a wafer according to an example embodiment.

The backup roller 260 serves to support the pressing roller 240 from an outside of the pressing roller 240. Meanwhile, the driving unit 150 (see FIG. 1) is connected to the backup roller 260 to deform the backup roller 260. To this end, the driving unit 150 may be connected to an axis 262 of the backup roller 260. For example, the driving unit 150 may be formed of an air cylinder connected to opposite ends of the axis 262 provided in the backup roller 260. As described above, while the backup roller 260 is deformed by the driving unit 150, force may be applied to the pressing roller 240 so that the central portion of the pressing roller 240 may be deformed into a convex or concave shape. In some embodiments, the driving unit 150 may elastically deform the backup roller 260 to control deformation of the pressing roller 240.

As described above, by deforming the shape of the pressing roller 240 by the deformation of the backup roller 260, the pressing force applied to the wafer W may be adjusted. Accordingly, the cleaning force of the wafer W may be efficiently and precisely controlled.

Meanwhile, by supporting the pressing roller 240 by the backup roller 260, it is possible to reduce vibrations and vibrations generated when the wafer W is cleaned. Furthermore, by deforming the backup roller 260 to deform the pressing roller 240, permanent deformation (i.e., plastic deformation) of the pressing roller 240 may be avoided. In other words, since force may not be applied directly to the pressing roller 240, permanent deformation of the central axis 242 of the pressing roller 240 may be suppressed.

The backup roller 260 may be disposed side by side with the pressing roller 240 and may have a size (e.g., length) corresponding to the size (e.g., length) of the pressing roller.

Figure 5:
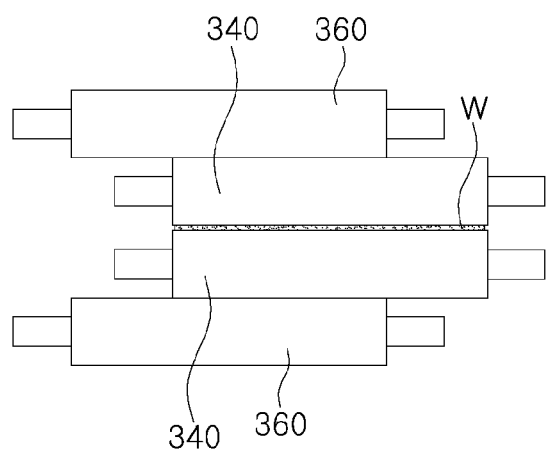
FIGS. 5 and 6 are illustrative views illustrating a pressing roller and a backup roller provided in the apparatus for cleaning a wafer according to an example embodiment.
Figure 6:
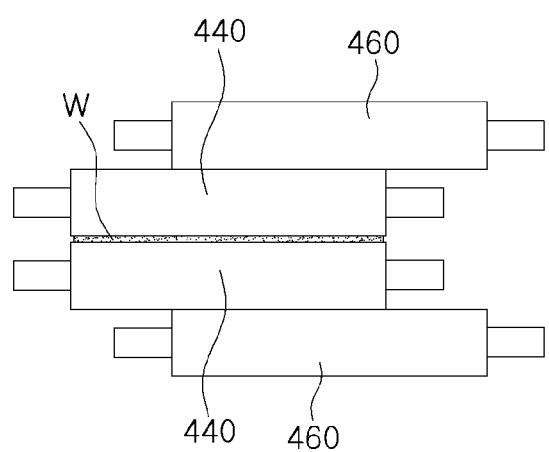

FIGS. 5 and 6 are illustrative views illustrating a pressing roller and a backup roller provided in an apparatus for cleaning a wafer according to an example embodiment.

First, referring to FIG. 5, a backup roller 360 may be disposed to protrude toward one end of a pressing roller 340. For example, as illustrated in FIG. 5, the backup roller 360 may be disposed to protrude to a left side of the pressing roller 340 to be disposed so that a central portion of the backup roller 360 supports one end of the pressing roller 340. Accordingly, pressing force by which the pressing roller 340 presses the edge of the water W may be greater than the central portion of the wafer W.

In addition, as illustrated in FIG. 6, the backup roller 460 may be disposed to protrude toward the other end of the pressing roller 440. For example, as illustrated in FIG. 6, the backup roller 460 is arranged to protrude to a right side of the pressing roller 440 to be disposed so that a central portion of the backup roller 460 supports the other end side of the pressing roller 440. Accordingly, pressing force by which the pressing roller 440 presses the edge of the wafer W may be greater than the central portion of the wafer W.

Figure 7:
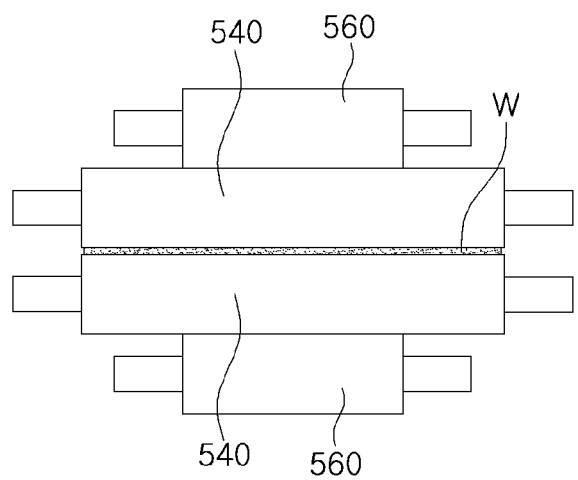
FIGS. 7 and 8 are illustrative views illustrating a pressing roller and a backup roller provided in the apparatus for cleaning a wafer according to an example embodiment.

FIG. 7 is an explanatory diagram illustrating a pressing roller and a backup roller provided in an apparatus for cleaning a wafer according to an example embodiment.

Referring to FIG. 7, a backup roller 560 may be disposed to support a central portion of a pressing roller 540. Meanwhile, the backup roller 560 may have a size, smaller than a size (e.g., length) of the pressing roller 540, and accordingly, the backup roller 560 may be disposed to support only the central portion of the pressing roller 540.

Figure 9:
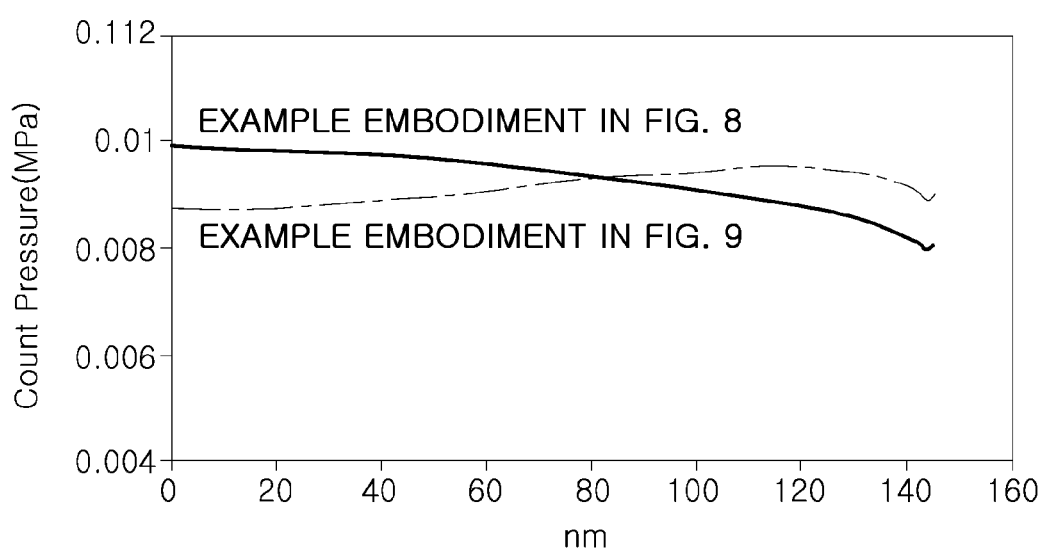
FIG. 9 is a graph illustrating pressing force applied to the wafer by the pressing roller and the backup roller illustrated in FIGS. 7 and 8.

Accordingly, pressing force applied to the wafer W by the pressing roller 540 may be greater than the pressing force at an edge of the wafer W at a central portion of the wafer W, as illustrated in FIG. 9.

Figure 8:
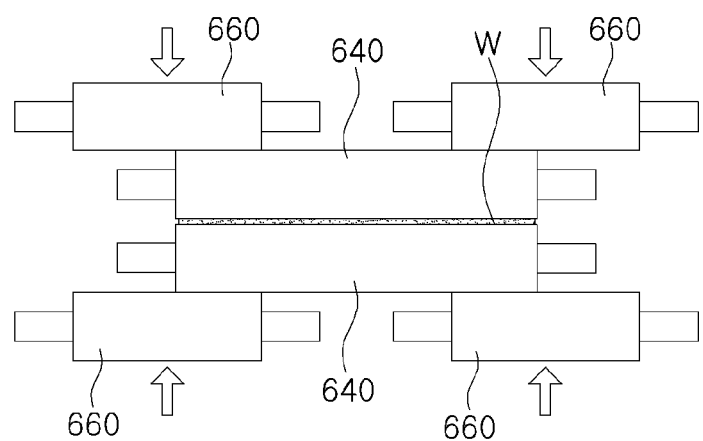

FIG. 8 is an explanatory diagram illustrating a pressing roller and a backup roller provided in an apparatus for cleaning a wafer according to an example embodiment.

Referring to FIG. 8, a backup roller 660 may be disposed to support opposite end portions of the pressing roller 640. For example, the backup rollers 660 may be respectively disposed one on opposite end portions of the pressing rollers 640, so that the four backup rollers 660 may support the pressing roller 640. Meanwhile, the backup roller 660 may have a size, smaller than a size (e.g., length) of the pressing roller 640, and accordingly, the backup roller 660 may be disposed to support only opposite end side portions of the pressing roller 640.

Accordingly, pressing force applied to the wafer W by the pressing roller 640 may be smaller than pressing force at an edge of the wafer W in a central portion of the wafer W, as illustrated in FIG. 9.

Figure 10:
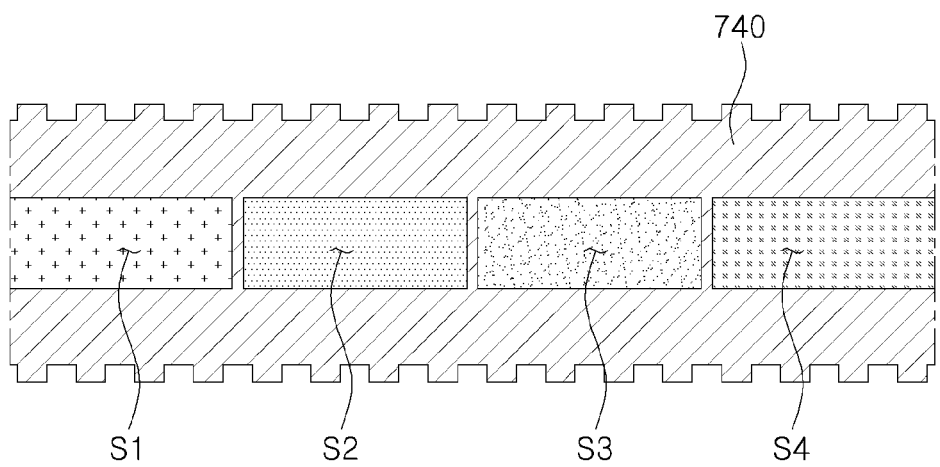
FIG. 10 is an explanatory diagram illustrating a pressing roller provided in the apparatus for cleaning a wafer according to an example embodiment.

FIG. 10 is an explanatory diagram illustrating a pressing roller provided in an apparatus for cleaning a wafer according to an example embodiment.

A pressing roller 740 may include a plurality of space portions S1 to S4 so that the pressing force applied to the wafer W (see FIG. 1) by pneumatic pressure varies. As an example, an amount of air filled in the plurality of space portions S1 to S4 may be different from each other. Accordingly, the pressing force for pressing the wafer in a region disposed above the plurality of space portions may be different from each other. Meanwhile, in the present example embodiment, a case in which four or more space portions are provided is described as an example, but the number of space portions may be variously changed.

As set forth above, according to the present inventive concept, an apparatus for cleaning a wafer capable of efficiently and precisely controlling cleaning power may be provided.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an example embodiment" used herein does not refer to the same example embodiment, and is provided to emphasize a particular feature or characteristic different from that of another example embodiment. However, example embodiments provided herein are considered to be able to be implemented by being combined in whole or in part one with one another. For example, one element described in a particular example embodiment, even if it is not described in another example embodiment, may be understood as a description related to another example embodiment, unless an opposite or contradictory description is provided therein.

Terms used herein are used only in order to describe an example embodiment rather than limiting the present disclosure. In this case, singular forms include plural forms unless interpreted otherwise in context.

While example embodiments have been shown and described above, it will be apparent to those skilled in the art that modifications and variations could be made without departing from the scope of the present inventive concept as defined by the appended claims.

What is claimed is:

1. A wafer cleaning apparatus, comprising:
a base;
a roller installation table installed on the base;
a wafer support unit disposed at the roller installation table and having a support roller for rotatably supporting an edge of a wafer;
a pressing roller installed on the roller installation table and above the wafer support unit, and configured to press opposite surfaces of the wafer, wherein the pressing roller includes a pair of pressing rods, and wherein each of the pair of pressing rods extends in a first direction, and the pair of pressing rods are spaced apart from each other in a second direction perpendicular to the first direction so that the wafer supported by the wafer support unit is accommodated into a gap between the pair of pressing rods; and
a driving unit providing a force in a direction, crossing a direction of a central axis of the pressing roller to bend the pair of pressing rollers inwardly or outwardly, wherein a shape of each pressing rod of the pair of pressing rods is deformable in response to the force by the driving unit, and wherein the pair of pressing rods bent by the driving unit applies a first pressure to a central portion of the wafer and a second pressure, different from the first pressure, to an edge portion of the wafer.

2. The wafer cleaning apparatus of claim 1,
wherein the driving unit is connected to opposite end portions of each of the pair of pressing rods, and
wherein the driving unit is configured to apply the force in the direction perpendicular to the central axis of the pressing roller so that a central portion of each of the pair of pressing rods is convex away or concave toward the central portion of the wafer.

3. The wafer cleaning apparatus of claim 1, further comprising:
a backup roller layered on the outside of the pressing roller.

4. The wafer cleaning apparatus of claim 3,
wherein the driving unit is connected to the backup roller, and
wherein the driving unit is configured to cause deformation of the backup roller to control the deformation of the pressing roller.

5. The wafer cleaning apparatus of claim 4,
wherein the driving unit is connected to an end portion of the backup roller, and
wherein the driving unit is configured to apply a force to the end portion of the backup roller in a direction perpendicular to a central axis of the backup roller to control the deformation of the pressing roller.

6. The wafer cleaning apparatus of claim 3,
wherein each of the pressing roller and the backup roller extends in the first direction,
wherein the backup roller and the pressing roller are disposed side by side in the second direction perpendicular to the first direction, and
wherein the pressing roller and the backup roller are the same in length in the first direction.

7. The wafer cleaning apparatus of claim 3,
wherein each of the pressing roller and the backup roller extends in the first direction,
wherein the backup roller and the pressing roller are disposed side by side in the second direction perpendicular to the first direction, and
wherein the backup roller protrudes from one end portion of the pressing roller in the first direction.

8. The wafer cleaning apparatus of claim 3,
wherein each of the pressing roller and the backup roller extends in the first direction,
wherein the backup roller and the pressing roller are disposed side by side in the second direction perpendicular to the first direction, and
wherein the backup roller has a length, in the first direction, smaller than a length, in the first direction, of the pressing roller.

9. The wafer cleaning apparatus of claim 8,
wherein the backup roller covers a central portion of the pressing roller and exposes an end portion of the pressing roller.

10. The wafer cleaning apparatus of claim 8,
wherein the backup roller is provided in plural, and
wherein the plurality of backup rollers are respectively disposed on opposite end portions of the pressing roller.

11. The wafer cleaning apparatus of claim 1,
wherein the wafer support unit and the pressing roller are configured to place the wafer in a vertical direction,
wherein the wafer support unit contacts an edge of a lower end portion of the wafer placed in the vertical direction,
wherein the pressing roller contacts the opposite surfaces of the wafer,
wherein the support roller of the wafer support unit is provided in plural, and
wherein the plurality of support rollers are configured to rotatably support the edge of the lower end portion of the wafer.

12. A wafer cleaning apparatus, comprising:
a base;
a roller installation table installed on the base;
a wafer support unit disposed between the roller installation table and having a support roller for rotatably supporting a wafer; and
a pressing roller installed on the roller installation table and above the wafer support unit, and configured to press opposite surfaces of the wafer,
wherein the pressing roller is provided with a plurality of space portions configured to apply a pneumatic pressure on the opposite surfaces of the wafer.

13. The wafer cleaning apparatus of claim 12,
wherein an amount of air filled in the plurality of space portions is different from each other.

14. A wafer cleaning apparatus, comprising:
a base;
a pair of first installation plates immovably fixed at the base and erected vertically from the base during an operation of the wafer cleaning apparatus;
a first pressing roller rotatably connected to the pair of first installation plates, wherein the first pressing roller extends in a first direction and the pair of first installation plates are spaced apart from each other in the first direction;
a pair of second installation plates immovably fixed at the base and erected vertically from the base during the operation of the wafer cleaning apparatus, wherein the pair of second installation plates are spaced apart from the pair of first installation plates in a second direction perpendicular to the first direction;
a second pressing roller rotatably connected to the pair of second installation plates, wherein the second pressing roller extends in the first direction and is spaced apart from the first pressing roller in the second direction; and
a plurality of support rollers disposed between the base and a gap between the first pressing roller and the second pressing rollers, wherein the plurality of support rollers are controlled to rotate in a same direction.

15. The wafer cleaning apparatus of claim 14, further comprising:
a pressing roller driver configured to apply a pressing force to opposite end portions of each of the first pressing roller and the second pressing rollers in a direction perpendicular to a central axis of each of the first pressing roller and the second pressing rollers.

16. The wafer cleaning apparatus of claim 15, further comprising:
a pair of first extensions; and
a pair of first connectors,
wherein the pair of first connectors connect opposite ends of the first pressing roller to the pair of first extensions.

17. The wafer cleaning apparatus of claim 16,
wherein the pair of first connectors are rotatably connected to the opposite ends of the first pressing roller.

18. The wafer cleaning apparatus of claim 17,
wherein the pair of first connectors are fixedly connected to the pair of first extensions, and
wherein the pair of first extensions penetrate the pair of first installation plates.

19. The wafer cleaning apparatus of claim 16,
wherein the pressing roller driver includes a pair of rods connected to the pair of first extensions,
wherein each of the pair of rods extends in the second direction, and
wherein the pressing force is delivered to the first pressing roller via the pair of rods.

20. The wafer cleaning apparatus of claim 14,
wherein each of the first pressing roller and the second pressing rollers is provided with a plurality of space portions configured to apply a pneumatic pressure on opposite surfaces of a wafer erected vertically in the gap between the first pressing roller and the second pressing rollers.

* * * * *